United States Patent
Tsutsui et al.

(10) Patent No.: US 7,116,173 B2
(45) Date of Patent: Oct. 3, 2006

(54) HIGH-FREQUENCY POWER AMPLIFIER CIRCUIT AND ELECTRONIC PART FOR COMMUNICATION

(75) Inventors: Takayuki Tsutsui, Saku (JP); Masahiro Tsuchiya, Komoro (JP); Tetsuaki Adachi, Tobu (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/498,489

(22) PCT Filed: Feb. 28, 2002

(86) PCT No.: PCT/JP02/01840

§ 371 (c)(1),
(2), (4) Date: Jun. 14, 2004

(87) PCT Pub. No.: WO03/073627

PCT Pub. Date: Sep. 4, 2003

(65) Prior Publication Data

US 2005/0218989 A1    Oct. 6, 2005

(51) Int. Cl.
*H03G 3/10* (2006.01)

(52) U.S. Cl. .................... 330/285; 330/296

(58) Field of Classification Search ............ 330/285, 330/296, 288, 279; 323/315, 316
See application file for complete search history.

(56) References Cited

U.S. PATENT DOCUMENTS

| 5,426,641 | A | 6/1995 | Afrashteh et al. |
| 6,433,639 | B1* | 8/2002 | Numanami et al. ......... 330/277 |
| 6,636,114 | B1* | 10/2003 | Tsutsui et al. ............... 330/51 |
| 6,756,850 | B1* | 6/2004 | Matsushita et al. ......... 330/285 |
| 6,759,906 | B1* | 7/2004 | Matsunaga et al. ......... 330/285 |

FOREIGN PATENT DOCUMENTS

| EP | 896439 | 2/1999 |
| JP | 3-179926 | 8/1991 |
| JP | 6-338729 | 12/1994 |
| JP | 11-26776 | 1/1999 |
| JP | 11-55131 | 2/1999 |
| JP | 2001-168647 | 6/2001 |

* cited by examiner

*Primary Examiner*—Henry Choe
(74) *Attorney, Agent, or Firm*—Mattingly, Stanger, Malur & Brundidge, P.C.

(57) ABSTRACT

A wireless communication system has a first operation mode (GSM mode) for amplifying a phase-modulated high frequency signal with a high frequency power amplifier circuit and a second operation mode (EDGE mode) for amplifying a phase and amplitude-modulated high frequency signal with the amplifier circuit. The amplifier circuit has an input of a high frequency signal, with the amplitude and frequency being fixed in both the first and second operation modes, and operates by being controlled for the bias state of each amplifying stage in accordance with the output control signal produced by a control circuit based on the demanded output level (Vapc) and the detected output level (VSNS) so that the amplifier circuit performs signal amplification to meet the demanded output level.

11 Claims, 7 Drawing Sheets

HIGH-FREQUENCY POWER AMPLIFIER CIRCUIT AND ELECTRONIC PART FOR COMMUNICATION

TECHNICAL FIELD

The present invention relates to a high frequency power amplifier circuit for amplifying an input high frequency signal with power amplifying elements which are field effect transistors, and to a technique which can be applied effectively to the wireless communication equipment such as a portable telephone unit which incorporates this high frequency power amplifier circuit. The invention particularly relates to a technique for operating a high frequency power amplifier circuit of the wireless communication equipment at optimal bias conditions in both the operation mode of using the saturation region and the linear operation mode of using the non-saturation region of power amplifying FETs (field effect transistors), and for detecting the output level for feedback control accurately based on the current detection scheme.

BACKGROUND ART

Among the conventional schemes of wireless communication equipment (mobile communication equipment) such as portable telephone units, one is GSM (Global System for Mobile Communication) which is adopted in European countries. The GSM scheme performs the phase modulation called GMSK (Gaussian Minimum Shift Keying) which shifts the phase of carrier wave in accordance with transmission data.

Generally, the transmission output stage of the wireless communication equipment incorporates a high frequency power amplifier circuit. Some GSM-based wireless communication equipment is designed to establish the communication output power level in need by controlling the bias voltage of the high frequency power amplifier circuit in accordance with the control voltage which is produced by the APC (Automatic Power Control) circuit based on the demanded transmission level from the baseband LSI and the signal from the transmission output detector.

In the field of recent portable telephone units, there is a proposal of the EDGE (Enhanced Data Rate for GMS Evolution) scheme having a dual mode communication function, in which audio signal communication is performed based on GMSK modulation and data communication is performed based on 8-PSK (Phase Shift Keying) modulation.

The 8-PSK modulation is the phase shift of carrier wave derived from the GMSK modulation, with amplitude shift being added. It is capable of sending 3-bit information per symbol, in contrast to the GMSK modulation which sends 1-bit information per symbol. Accordingly, the EDGE scheme can perform communication at the higher transmission rate than the GSM scheme.

The high frequency power amplifier circuit of the GSM-based communication system can operate in the saturation region for amplifying the phase-modulated signal in accordance with the demanded output level, whereas the high frequency power amplifier circuit of the wireless communication system, which performs the EDGE-based transmission/reception, necessitates the amplitude control and therefore must have a linear operation in the non-saturation region.

For the high frequency power amplifier circuit of the communication system which is operative based on both the GSM scheme and EDGE scheme, a conceivable operational manner of the high frequency power amplifier circuit is to control the gate bias voltage of the output FET in accordance with the demanded output level, with the input signal amplitude being fixed, in the GSM mode which has GMSK modulation, and to control the output power by varying the input signal amplitude, with the gate bias voltage of the output FET being fixed, in the EDGE mode which has 8-PSK modulation.

Figure 2:
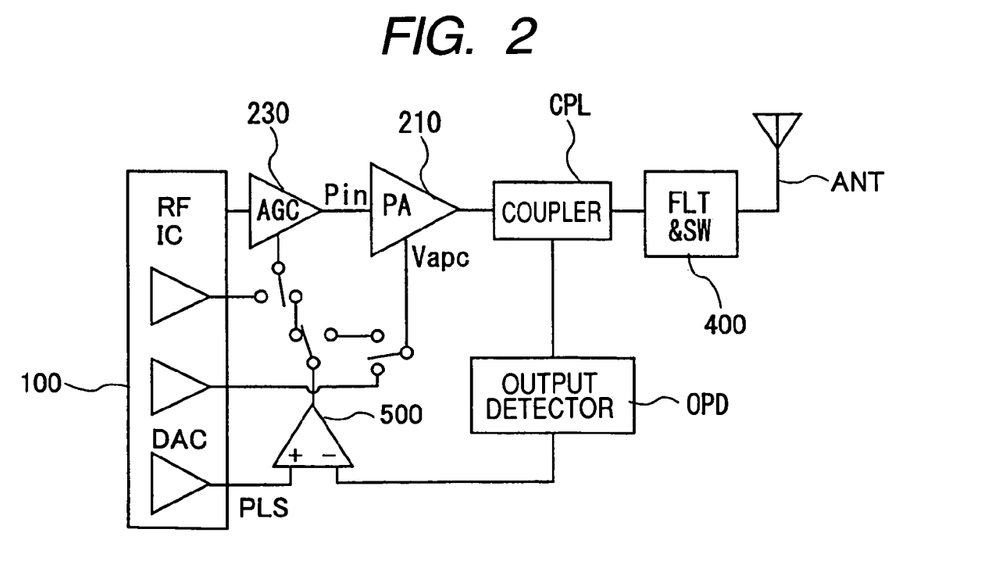
FIG. 2 is a block diagram showing the arrangement of a wireless communication system which is designed for GSM-based and EDGE-based transmission and reception, and which was studied by the inventors prior to the present invention.

However, this manner necessitates a variable-gain amplifier and its control circuit for varying the input signal amplitude in the EDGE mode, resulting in an increased circuit scale (refer to FIG. 2). Moreover, for the enhancement of modulation accuracy and power efficiency at a small output level, it is necessary to control the bias voltages of the variable-gain amplifier and the high frequency power amplifier circuit simultaneously, resulting in an intricate control system.

In the case of the fixed gate bias voltage scheme, with satisfactory linear characteristics being intended in the EDGE mode in which the high frequency power amplifier circuit must have a linear operation, a large idle current is needed to flow by setting such an output FET bias voltage as to have a higher gain relatively to the GSM mode. However, the gain is too high for a small input signal level, and a resulting amplified noise component gives rise to an increased noise leakage to the reception frequency band which is separated by 20 MHz or more from the transmission frequency.

In the wireless communication system, the high frequency power amplifier circuit has its output power controlled in accordance with the demanded output level from the control circuit (baseband circuit, etc.) and based on the feedback of the output of high frequency power amplifier circuit or antenna detected with a coupler and detection circuit. In this respect, the inventors of the present invention studied a current sensing scheme for detecting the output level from the output current of the high frequency power amplifier circuit within the semiconductor chip with the intention of making the circuit scale smaller. The study revealed a problem of this scheme when applied to the control of output power by varying the input signal amplitude, with the gate bias voltage being fixed. Namely, the high frequency power amplifier circuit produces a too small output current variation relative to the DC bias component, particularly at a small output level, and a resulting poor sensitivity of output level detection disables accurate output control and invites the fluctuation of detection level in response to the temperature variation and power voltage variation.

It is an object of the present invention to provide, for a wireless communication system having both of phase modulation and amplitude modulation, a high frequency power amplifier circuit and an electronic component part (module) incorporating the circuit which are capable of reducing the circuit scale by eliminating the need of an amplifier circuit dedicated to vary the input signal amplitude to meet the demanded output level.

Another object of the present invention is to provide, for a wireless communication system having both of phase modulation and amplitude modulation, a high frequency power amplifier circuit and an electronic component part incorporating the circuit which are capable of alleviating the signal leakage to the reception frequency band by lowering the gain of amplifier circuit during a linear operation.

Still another object of the present invention is to provide, for a wireless communication system having both of phase modulation and amplitude modulation, a high frequency power amplifier circuit and an electronic component part incorporating the circuit which are capable of detecting the output level to be fed back based on the current sensing scheme and capable of having a sufficient detection sensitivity even at a small output level thereby to perform accurate output control.

These and other objects and novel features of the present invention will become apparent from the following description and attached drawings.

DISCLOSURE OF THE INVENTION

Among the affairs of the present invention disclosed in this specification, representatives are briefed as follows.

A first part of the present invention, which is intended for a wireless communication system having a first operation mode of amplifying a phase-modulated high frequency signal with a high frequency power amplifier circuit and a second operation mode of amplifying a phase and amplitude-modulated high frequency signal with the high frequency power amplifier circuit, is designed to put in a high frequency signal of a fixed amplitude and frequency to the high frequency power amplifier circuit and control the bias states of the amplifying stages of amplifier circuit in accordance with a control signal which is produced by a control circuit based on a demanded output level and detected output level, thereby performing the signal amplification to meet the demanded output level. In consequence, the output level can be controlled by the same control system for both the first and second operation modes without the need of a variable-gain amplifier for the preceding stage of the high frequency power amplifier circuit, whereby the control system can be simplified.

A second part of the present invention, which is intended for a wireless communication system which requires a linear operation of a high frequency power amplifier circuit, is designed to configure the first-stage amplifier of amplifier circuit with a dual-gate FET or two FETs in serial connection, with an input high frequency signal and a first bias voltage being put in to the first gate terminal of the FET and with a second bias voltage which is higher than the first bias voltage being put in to the second gate terminal, and to create by the first bias voltage such a bias state as to render the linear characteristics to the first-stage amplifier and suppress the gain of the first-stage amplifier by the second bias voltage. In consequence, the high frequency power amplifier circuit has its gain lowered during the linear operation, whereby the signal leakage to the reception frequency band can be alleviated.

A third part of the present invention, which is intended for a wireless communication system having its output level controlled based on the demanded output level and the output level detected by an output detection means, is designed to include an output level detection means made up of a transistor which receives the input voltage of the last-stage amplifier of the high frequency power amplifier circuit, a current mirror circuit which replicates the transistor current, and a resistor which converts the replicated current into a voltage. In consequence, the amplified output level to be fed back can be detected based on the current detection scheme and a sufficient detection sensitivity is ensured even at a small output level, whereby accurate output control can take place.

BEST MODE FOR CARRYING OUT THE INVENTION

Embodiments of this invention will be explained in detail with reference to the drawings.

Figure 1:
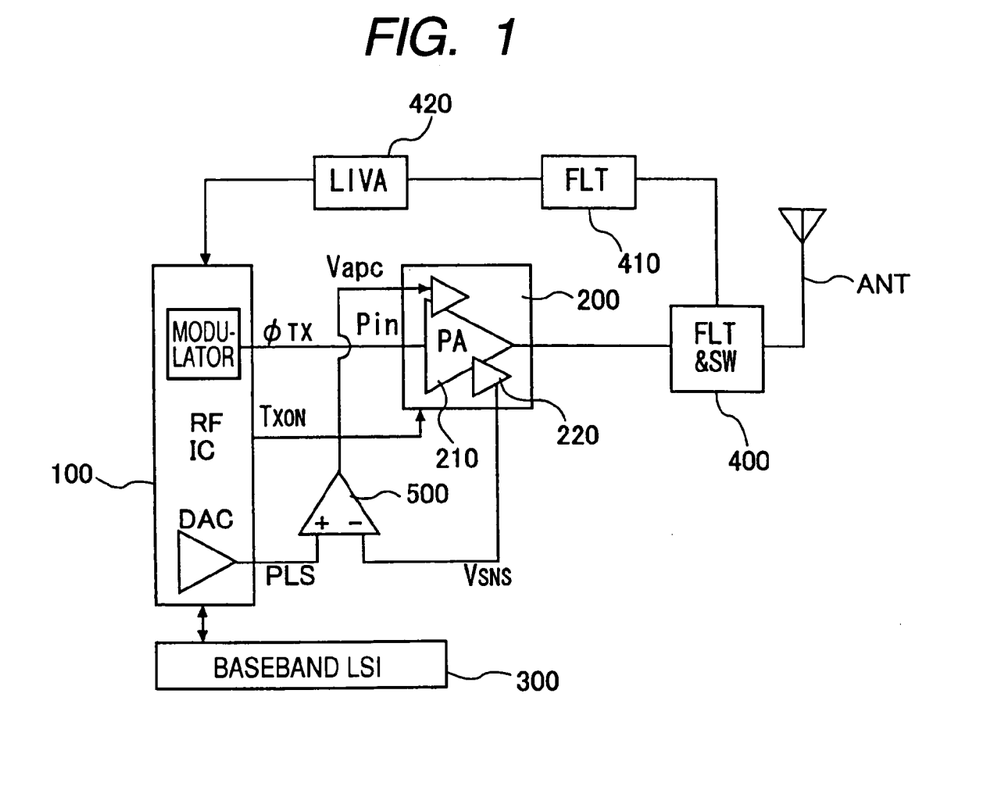
FIG. 1 is a block diagram showing the arrangement of a wireless communication system which uses the high frequency power amplifier circuit based on this invention.

FIG. 1 shows the arrangement of the transmission system of the wireless communication equipment based on this invention which can perform the EDGE-based communication. The system includes a high frequency IC 100 having a modulation circuit which is designed for GMSK modulation of the GSM scheme and 8-PSK modulation of the EDGE scheme, a power module 200 including a high frequency power amplifier circuit (will be termed simply "power amplifier" hereinafter) 210 used for transmission in unison with an antenna ANT and an output detecting circuit 220 for measuring the transmission power, a baseband circuit in the form of a semiconductor integrated circuit (will be termed "baseband LSI") 300 for producing an I/Q signal in accordance with sending data (baseband signal) and a control signal for the high frequency IC 100, a front-end module 400 including an impedance matching circuit which is connected to the transmission output terminal, a filter and a send/receive switch, and an output control circuit 500 for producing an output control voltage Vapc for the power amplifier 210 by comparing the signal from the output detecting circuit 220 in the power module 200 with an output level command signal PLS from the high frequency IC 100 so that the output power level of the power module 200 accords with the command signal PLS.

The output level command signal PLS is produced by the high frequency IC 100 under control of the baseband LSI 300. The command signal level is low when the communication distance to the base station is near or it is high when the distance is far. Specifically, the characteristics of the high frequency IC 100 and power module 200 are examined in advance to produce data indicative of the correspondence between the demanded output level and the output level command signal PLS and recorded in the internal nonvolatile memory or the like of the baseband LSI 300 so that the high frequency IC 100 releases an output level command signal PLS by looking up the table of recorded data in response to a demanded output level resulting from the communication with the base station. In case the high frequency IC 100 includes a circuit for correcting the disparity of characteristics, correction data may also be recorded in the internal nonvolatile memory of the baseband LSI 300.

The high frequency IC 100 releases a transmission start signal TXON under control of the baseband LSI 300 besides the output level command signal PLS. Alternatively, the transmission start signal TXON may be issued directly from the baseband LSI 300 to the power module 200.

The arrangement of FIG. 1 further includes a filter 410 for eliminating unwanted wave components from the received signal, and a low-noise amplifier 420 for amplifying the received signal to be fed to the high frequency IC 100. The high frequency IC 100 of this embodiment can incorporate a reception system including a mixer for down-converting the received signal into an intermediate-frequency signal and a high-gain programmable-gain amplifier, although this affair is not compulsory. The low-noise amplifier 420 may be incorporated in the high frequency IC 100.

The high frequency IC 100 of this embodiment has functions of sending a signal which is GMSK-modulated based on the GSM scheme and sending a signal which is 8-PSK-modulated based on the EDGE scheme. Which of GSM-based transmission (GSM mode) or EDGE-based transmission (EDGE mode) is instructed by the base band LSI 300. For GSM mode transmission, the high frequency IC 100 implements the GMSK modulation for rendering phase modulation to the carrier wave in accordance with information to be sent, and a resulting phase-modulated transmission signal φTX is fed as a high frequency signal Pin to the power module 200. For EDGE mode transmission, the high frequency IC 100 implements the 8-PSK modulation for rendering phase shift and amplitude shift to the carrier wave in accordance with information to be sent, and a resulting phase/amplitude-modulated signal is fed to the power module 200.

FIG. 2 shows the system arrangement which was studied prior to the present invention. This system is designed to perform the EDGE-based transmission by application of the conventional general GSM scheme, and it has a variable-gain amplifier (AGC) 230 for amplitude control (output level control) for the preceding stage of a power amplifier (PA) 210. For output detection means, a current sensing output detection circuit, which was considered initially, is deficient in sensitivity of detection for the smaller output level range when the power amplifier for GSM is used intact, and therefore it was determined for this system to use a coupler CPL connected to the output of power amplifier and an output detection circuit OPD made up of a detector and amplifier circuit as in the case of the conventional GSM-based system. FIG. 2 does not show the circuitry of transmission system and the baseband circuit.

The following Table 1 shows the setting manners of the input signal Pin and output control voltage Vapc to the power amplifier 210 for the system of this embodiment shown in FIG. 1 and for the studied system shown in FIG. 2.

TABLE 1

|  | This embodiment | | Studied circuit | |
| --- | --- | --- | --- | --- |
|  | GSM | EDGE | GSM | EDGE |
| Pin | Fixed | Fixed | Fixed | Variable |
| Vapc | Variable | Variable | Variable | Fixed |

In the GSM mode, both of the system of this embodiment and the studied system have their input signal Pin fixed in frequency and amplitude and have their output power controlled (varied) in accordance with the output control voltage Vapc.

In the EDGE mode, the studied system has its input signal Pin varied in amplitude by the variable-gain amplifier (AGC) 230 and has its output control voltage Vapc kept constant. For the operational control, there is provided a switch for turning the destination of the control voltage Vapc produced by the bias control circuit 500 from the power amplifier (PA) 210 to the variable-gain amplifier 230 so as to control the gain of the variable-gain amplifier 230, thereby controlling the amplitude of output signal (input signal Pin to the power amplifier 210).

The system of this embodiment, also in the EDGE mode, has its input signal Pin fixed in frequency and amplitude and has its output power controlled (varied) in accordance with the output control voltage Vapc; Accordingly, it can control the high frequency power amplifier circuit with the same control circuit in both the GSM mode and EDGE mode, and does not necessitate a variable-gain amplifier for amplitude control. Consequently, the system arrangement can be simplified and the number of component parts or the chip size in the case of semiconductor integration can be reduced. The power amplifier 210 is designed to allow the use of the same control circuit in both modes as will be explained in the following.

Figure 3:
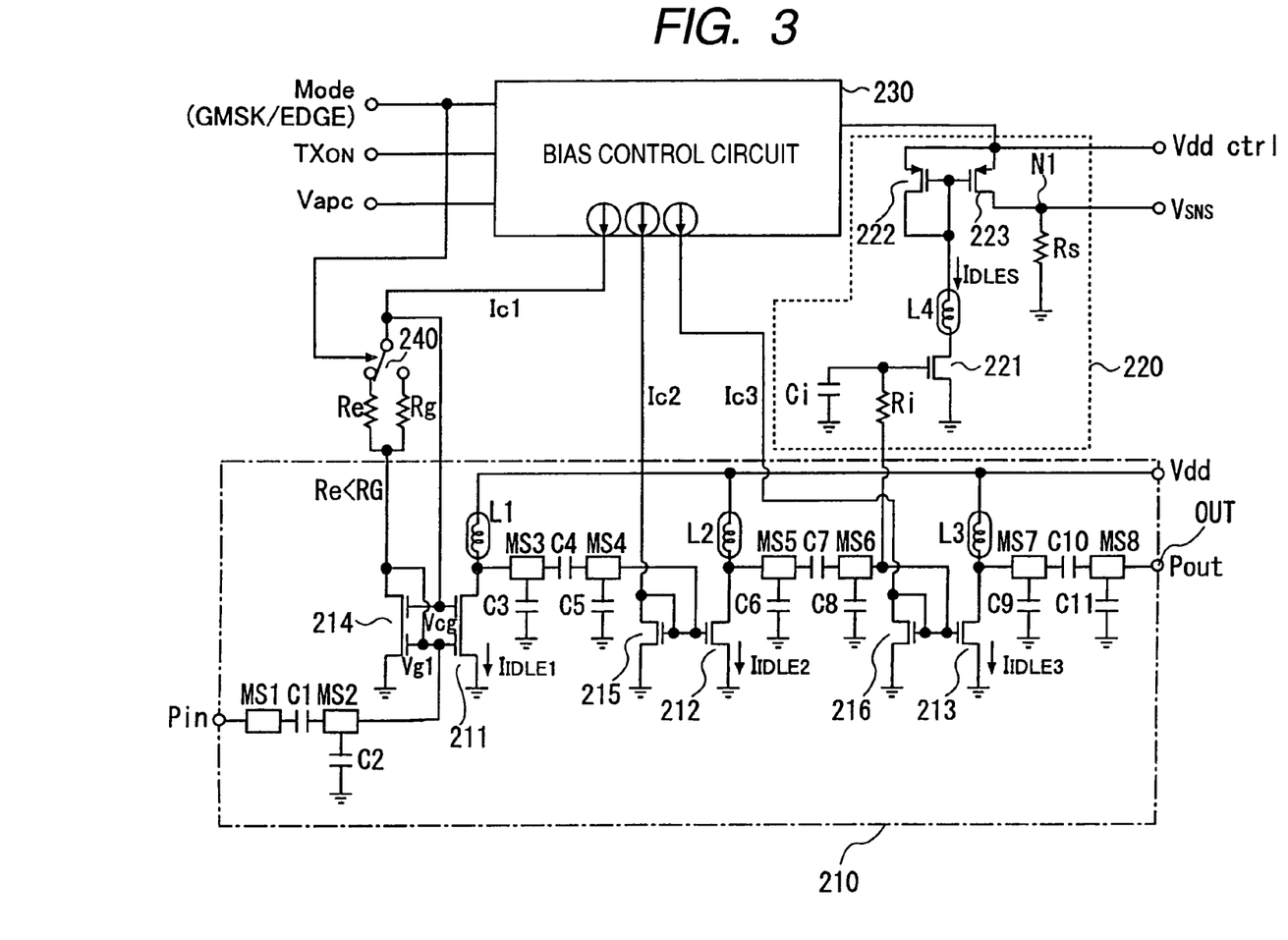
FIG. 3 is a schematic circuit diagram showing the high frequency power amplifier circuit based on an embodiment of this invention.

FIG. 3 shows a specific circuit arrangement of the power module 200 of this embodiment. The power module 200 is made up of a high frequency power amplifier circuit 210 including power amplifying FETs which amplify the input high frequency signal Pin, an output detecting circuit 220 which measures the output power of the amplifier circuit 210, and a bias control circuit 230 which controls the idle current flowing through the power amplifying FETs of all stages of the amplifier circuit 210.

The high frequency power amplifier circuit 210 of this embodiment includes three power amplifying FETs 211,212 and 213, with the FETs 212 and 213 having their gate terminals connected to the drain terminals of the FETs 211 and 212, respectively, thereby constituting a 3-stage amplifier circuit, although this affair is not compulsory. The FETs 211,212 and 213 have their gate terminals connected to the gate terminals of MOSFETs 214,215 and 216, respectively, thereby forming current mirror circuits. The bias control circuit 230 feeds control currents Ic1, Ic2 and Ic3 to the current mirror MOSFETs 214, 215 and 216 so that idle currents I IIDLE1, I IIDLE2 and I IIDLE3, which are equal or proportional to the control currents Ic1, Ic2 and Ic3, flow through the FETs 211, 212 and 213. The bias control circuit 230 and the MOSFETs 214,215 and 216 of current mirror circuits in combination can be conceived to be a biasing circuit.

The FETs 211,212 and 213 have their drain terminals supplied with a power voltage Vdd through respective inductance elements L1, L2 and L3. The high frequency input signal Pin is put in through a capacitor C1 to the gate terminal of the first-stage FET 211. The last-stage FET 213 has its drain terminal connected through a capacitor C10 to the output terminal OUT. Accordingly, the amplifier circuit 210 amplifies only the a.c. component of the high frequency input signal Pin and puts out an amplified signal Pout. The output signal Pout has its power level controlled by the control currents Ic1, Ic2 and Ic3 provided by the bias control circuit 230.

In this embodiment, the first-stage FET 211 and the current mirror MOSFET 214 each consist of a so-called dual-gate MOSFET having two gate electrodes for a channel. The current mirror MOSFET 214 has a serial connection of a resistor Re or Rg, with the voltages on both ends of Re or Rg being applied to the first gate and the second gate of the first-stage power FET 211, causing the power FET 211 to have a flow of idle current I IIDLE1 which is equal or proportional to the control current Ic1. The high frequency input signal Pin is put in to the first gate terminal of the FET 211 having the idle current I IIDLE1.

Figure 6:
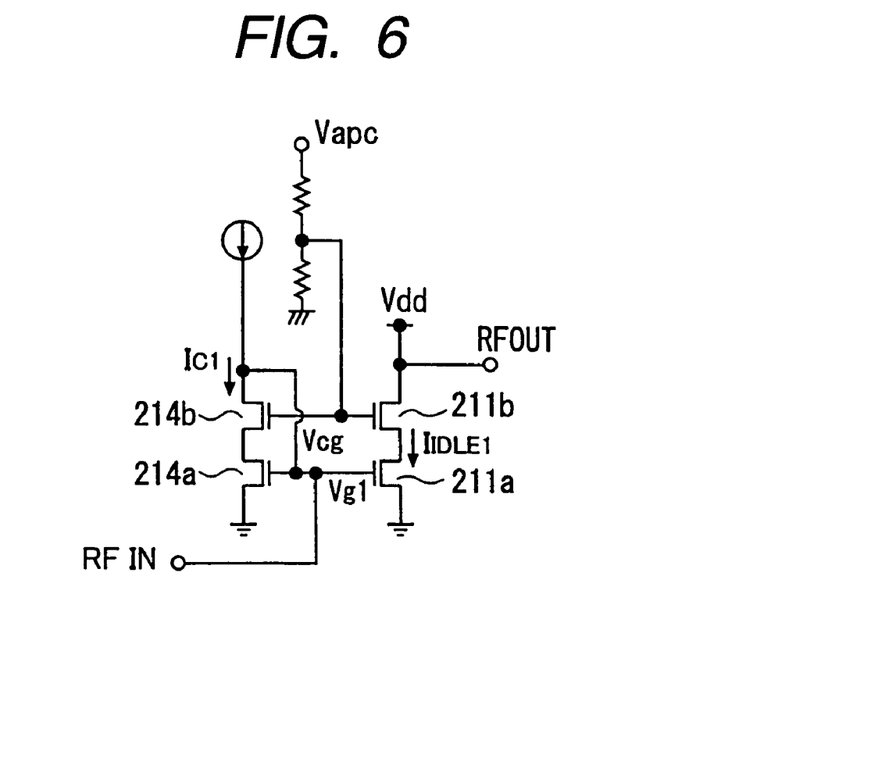
FIG. 6 is a schematic circuit diagram showing the first-stage amplifier circuit based on another embodiment of this invention.
Figure 7:
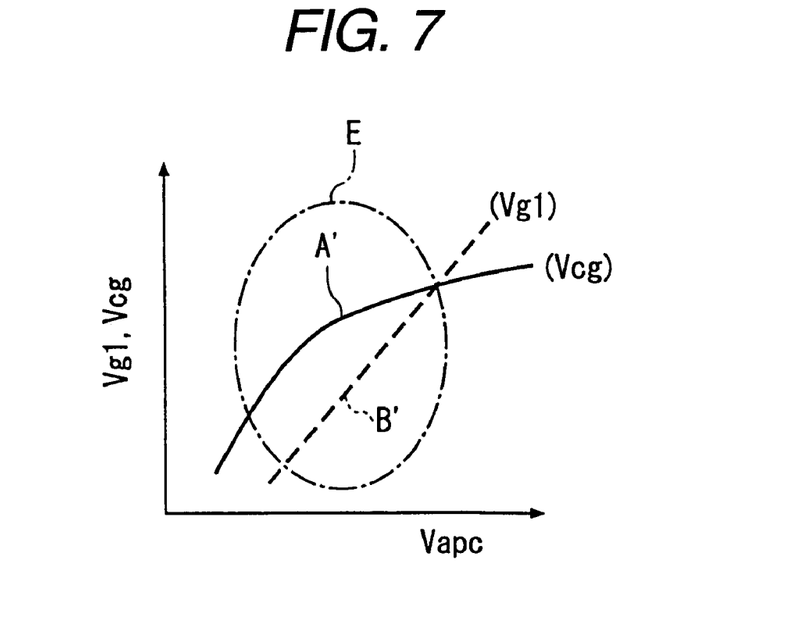
FIG. 7 is a graph showing the relation between the output control voltage and the bias voltage which is applied to the first and second gates of the first-stage power FET in the high frequency power amplifier circuit, with the embodiment of FIG. 6 being applied thereto.

Although a dual-gate MOSFET is used in this embodiment for the expedience of fabrication, it can be replaced with two MOSFETs 211a and 211b connected in series as shown in FIG. 6 for example, with both cases having the same circuit operation.

Figure 4:
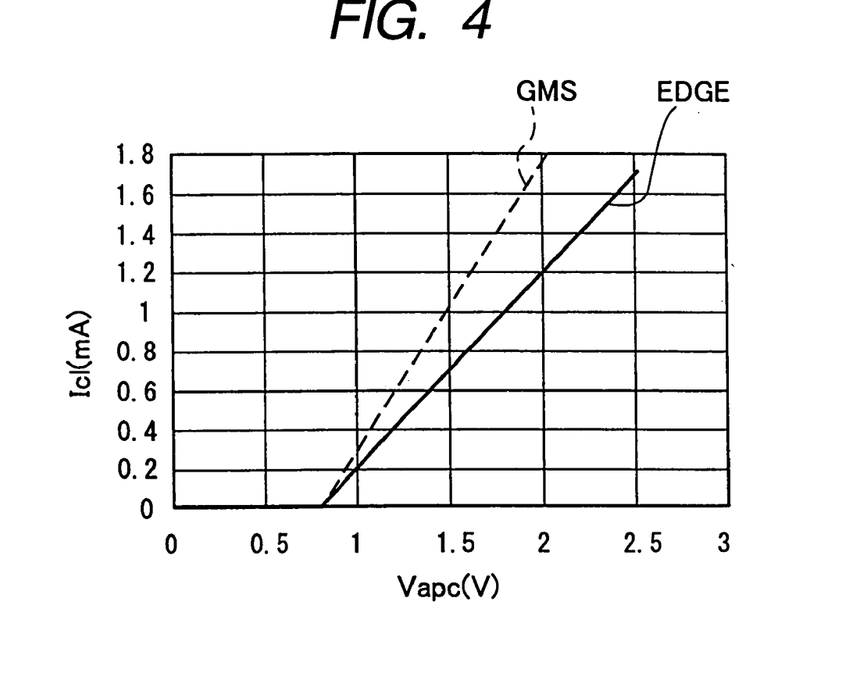
FIG. 4 is a graph showing the relation between the output control voltage of the high frequency power amplifier circuit and the control current which is supplied from the bias control circuit to the first-stage amplifier circuit.

The bias control circuit 230 starts operating in response to a start control signal TXON provided by the high frequency IC 100 (or baseband LSI 300). For biasing the 3-stage FETs 211,212 and 213, the circuit 230 produces control currents Ic1, Ic2 and Ic3 for the EDGE mode or produces control currents Ic1', Ic2' and Ic3' for the GSM mode (Ic1'>Ic1, Ic2'>Ic2, Ic3'>Ic3) depending on the mode command signal MODE issued by the high frequency IC 100 (or baseband LSI 300). FIG. 4 shows the relation between the output control voltage Vapc and the control currents Ic1 and Ic1' (Ic2 and Ic3 are both virtually the same) produced by the output power control circuit 500 in accordance with Vapc. On the graph of FIG. 4, the solid line represents the current Ic1 for the EDGE mode and the dashed line represents the current Ic1' for the GSM mode.

The first-stage power FET 211 is connected to the bias control circuit 230 through the resistor Re or Rg and a switch 240 so that the control current Ic1 of the EDGE mode is fed through the resistor Re or the control current Ic1' of the GSM mode is fed through the resistor Rg. The Rg has its resistance set larger than that of Re so that the first-stage FET 211 has better linearity for the input signal on the first gate in the EDGE mode. The first-stage FET 211 has its second gate supplied with a bias voltage Vcg which is always higher than the bias voltage Vg1 of the first gate by a voltage drop across the resistor Re or Rg.

Figure 5:
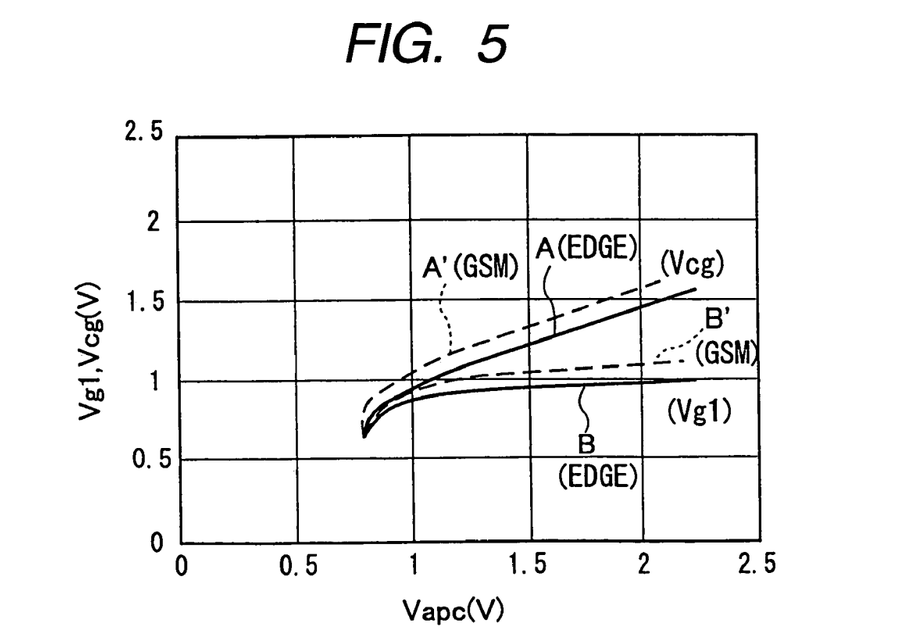
FIG. 5 is a graph showing the relation between the output control voltage and the bias voltage applied to the first and second gates of the first-stage power FET of the high frequency power amplifier circuit.

FIG. 5 shows the variation of voltages Vg1 and Vcg which are applied to the first gate and second gate, respectively, of the FET 211 when the control current Ic1 flows through the current mirror MOSFET of the first-stage amplifier. The solid line represents the gate voltage for the EDGE mode and the dashed line represents the gate voltage for the GSM mode in correspondence to FIG. 4.

Based on the input of high frequency signal Pin to the first gate of the dual-gate MOSFET which serves for the first-stage FET 211 and the application of bias voltages Vg1 and Vcg which comply with the output control voltage Vapc to the first gate and second gate, respectively, the gain of FET can be more suppressed according to this embodiment on condition that the input high frequency signal Pin is constant, as compared with the case of putting in the high frequency signal Pin and applying the bias voltage which comply with the output control voltage Vapc to the gate terminal of the usual single-gate power FET.

A conceivable reason is as follows. In case a high frequency signal Pin of certain magnitude from a transmission oscillator or the like is put in to the gate of power FET 211 and the demanded output level is low, it is necessary to attenuate the input signal. If attenuation is attempted by solely controlling the gate bias voltage Vg1 while fixing the FET drain voltage, the FET has its bias state varied significantly, causing the signal to be distorted. In contrast, by lowering the voltage of the first gate and, at the same time, lowering the voltage of the second gate of the dual-gate MOSFET which serves for the power FET 211, it is possible to lower the gain of FET. This situation is more easily understood in the case of FETs 211a and 211b connected tandem as shown in FIG. 6. When the gate bias voltage Vg1 of FET 211a is lowered and, at the same time, the drain voltage of FET 211a is lowered by manipulating the gate voltage Vcg of FET 211b, the source-drain voltage can be varied in virtually the same proportion as the variation of gate-source voltage of FET 211a and accordingly it is possible to lower the gain of FET 211a in response to the fall of Vg1 while virtually retaining the biasing of FET 211a. Namely, by controlling the two gate voltages appropriately, it is possible to lower the gain of FET without sacrificing the class-A amplification characteristics, i.e., linearity, of FET.

This embodiment is designed to increase the idle current I IIDLE 1 based on the bias voltage Vg1 of the first gate of dual-gate MOSFET, while suppressing the gain with the second gate, whereby it is possible to prevent the emergence of increased noise in the reception band caused by excessive gain of the power amplifier in the linear operation of the first-stage FET 211 in the EDGE mode.

Figure 8:
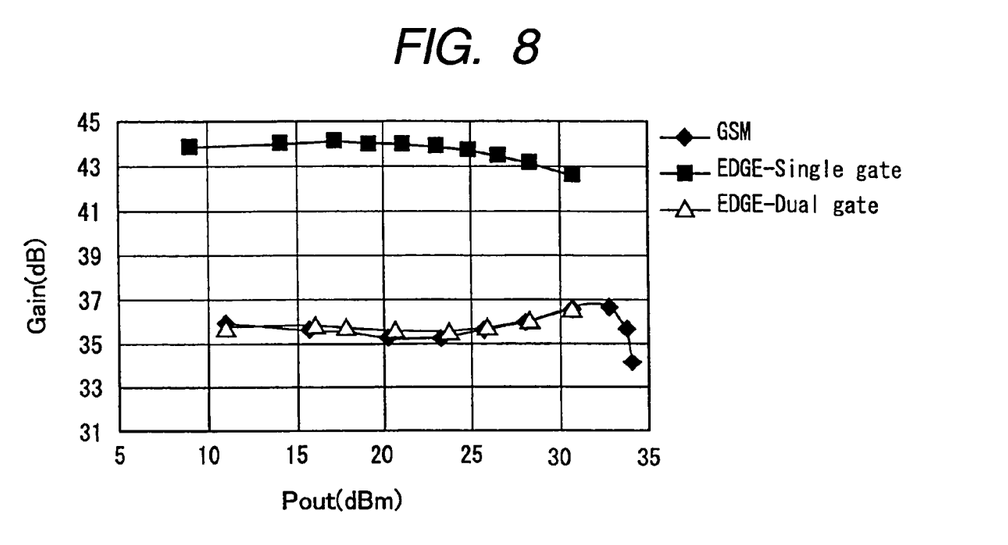
FIG. 8 is a graph showing the relation between the output power and the total gain of the high frequency power amplifier circuit operating in the GSM mode and in the EDGE mode.

Specifically, in the case of a single-gate FET for the first-stage FET 211 in the circuit of FIG. 3, the gate bias must be increased by raising the output control voltage Vapc to some extent in order to secure the linearity, which results in a significantly high gain in the EDGE mode (plotted by normal square symbols) as compared with the gain in the GSM mode (plotted by skew square symbols) as shown in FIG. 8. In contrast, using a dual-gate MOSFET for the first-stage FET 211 enables the reduction of gain in the EDGE mode down to the gain of the GSM mode as shown by triangular symbols in FIG. 8. In consequence, it is possible to prevent the emergence of increased noise in the reception band caused by excessive gain of the power amplifier.

FIG. 8 is intended to compare the gain values of the first-stage FET 211 across the range of output power Pout which is varied by the input signal Pin when the power voltage Vdd is 3.5 V, transmission frequency is 900 MHz, and output control voltage Vapc is 1.3 V for GSM mode and 1.6 V for EDGE mode.

In the circuit of FIG. 3, the output control voltage Vapc varies as shown by the solid lines A and B in FIG. 5. Regardless of the variation of output control voltage Vapc, the first-stage power FET 211 has its gate voltages controlled such that the voltage Vcg of the second gate is always higher than the voltage Vg1 of the first gate. Inconsequence, it is possible to prevent the gain of first-stage FET from falling too much, thereby improving EVM (Error Vector Magnitude). Although the circuit can operate even though Vg1 is higher than Vcg, the resulting degraded linearity of FET 211 distorts the output signal. Making Vcg higher than Vg1 is advantageous in improving EVM.

In this embodiment, the voltages produced on the ends of resistor Re or Rg by the current Ic1 which is fed to the current mirror circuit of the first-stage amplifier are applied to the first gate and second gate, and therefore Vcg is always higher than Vg1. Alternatively, voltages produced independently to meet this condition may be applied to the first and second gates. In addition to the condition of Vcg>Vg1, it is desirable to control the value of Vcg−Vg1 within the range which meets Vcg−Vg1<1.2Vth, where Vth is the threshold voltage of FET.

The circuit shown in FIG. 6 employs a pair of FETs 211$a$ and 211$b$ and another pair of FETs 214$a$ and 214$b$ in place of dual-gate FETs. The idle current I IIDLE 1 which is proportional to the control current Ic1 is fed by the current mirror FET 214$a$ to flow through the first-stage power amplifying FET 211$a$, and the output control voltage Vapc is applied to the gate terminal of the FET 211$b$ located on the drain side of FET 211$a$. Consequently, a voltage shown by the solid line A' is applied as Vcg to the gate of FET 211$b$, and a voltage shown by the dashed line B' is applied as Vg1 to the gate of FET 211$a$.

Figure 9:
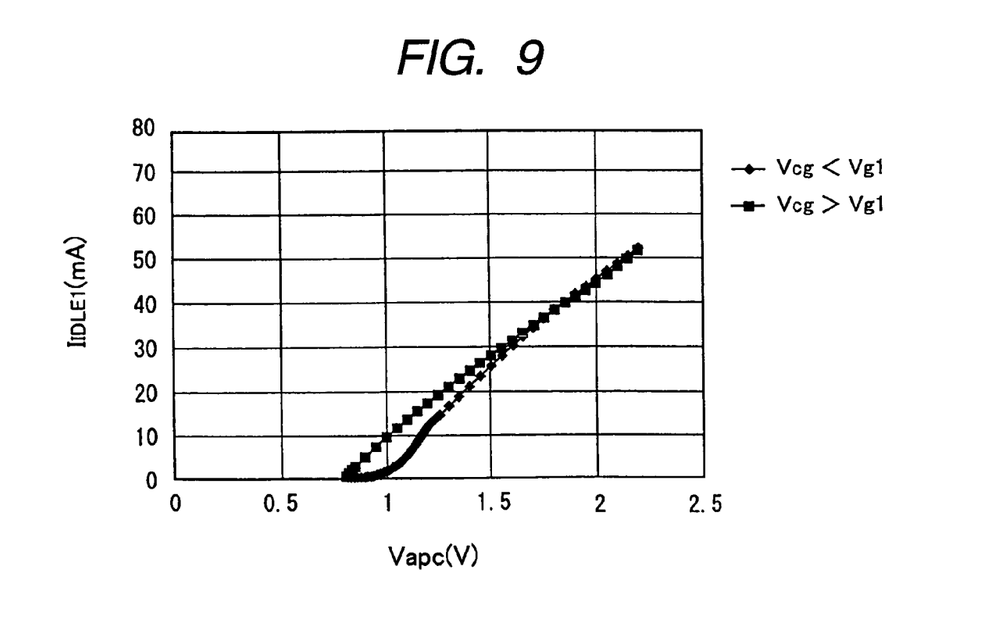
FIG. 9 is a graph showing the relation between the idle current conducted to the first-stage power FET and the output control voltage of the high frequency power amplifier circuit of this embodiment in the cases of the first and second gates of the first-stage power FET having the application of bias voltages, of which one is higher than or lower than the other.

In the circuit of FIG. 6, if Vg1 becomes higher than Vcg, the idle current I IIDLE 1 of FETs 211$a$ and 211$b$ sags as shown by the plots of skew squares in FIG. 9, and a resulting increased output signal distortion deteriorate the EVM. Whereas, by operating the first-stage amplifier of FIG. 6 within the range shown by the dashed line E in which the condition of Vcg>Vg1 holds, the idle current I IIDLE 1 of FETs 211$a$ and 211$b$ can vary in proportion to the output control voltage Vapc as shown by the plots of normal squares in FIG. 9. The circuit of FIG. 3 also always meets the condition of Vcg>Vg1, and the idle current I IIDLE 1 varies in proportion to the output control voltage Vapc.

Consequently, the distortion of output signal decreases, improving the EVM. By operating the amplifier circuit to have the voltages Vg1 and Vcg of the first and second gates retaining the condition of Vcg>Vg1 so that the drain current of the last-stage FET 213 varies vigorously, the sensitivity of output current detection can be improved as will be explained in the following.

Next, the output detection circuit 220 in the power module 200 of this embodiment shown in FIG. 3 will be explained. The output detection circuit 220 consists of a MOSFET 221 having its gate terminal supplied through a resistor Ri with the same voltage as the gate voltage of the last-stage power amplifying FET 213, an inductance element L4 and MOSFET 222 connected in series between the MOSFET 221 and the power voltage terminal Vdd_ctrl, a MOSFET 223 connected in parallel to the MOSFET 222, a current-voltage converting resistor Rs connected in series to the MOSFET 223, and an input impedance matching capacitor Ci connected between the gate terminal of MOSFET 221 and the ground.

The MOSFET 222 has its gate and drain connected together and the MOSFET 223 has its gate connected to the gate of MOSFET 222, thereby forming a current mirror circuit. For minimizing the current flowing through the output detection circuit 220, an FET which is lower in rating than the last-stage power amplifying FET 213 is used for the output detecting MOSFET 221.

By application to the gate of MOSFET 221 of the same voltage as the gate voltage of the last-stage power amplifying FET 213, a current which is proportional to the drain current of FET 231 flows through the MOSFET 221, and this current is duplicated by the current mirror circuit to flow through the resistor Rs. Accordingly, the voltage VSNS on the connection node N1 of the resistor Rs and MOSFET 223 is proportional to the current of the last-stage power amplifying FET 213. The voltage VSNS which represents the output level detection signal is fed back to the output control circuit 500 of FIG. 1, which compares the voltage VSNS with the output level command signal PLS from the base band LSI 300 to produce the output control voltage Vapc to be fed to the bias control circuit 230.

Figure 10:
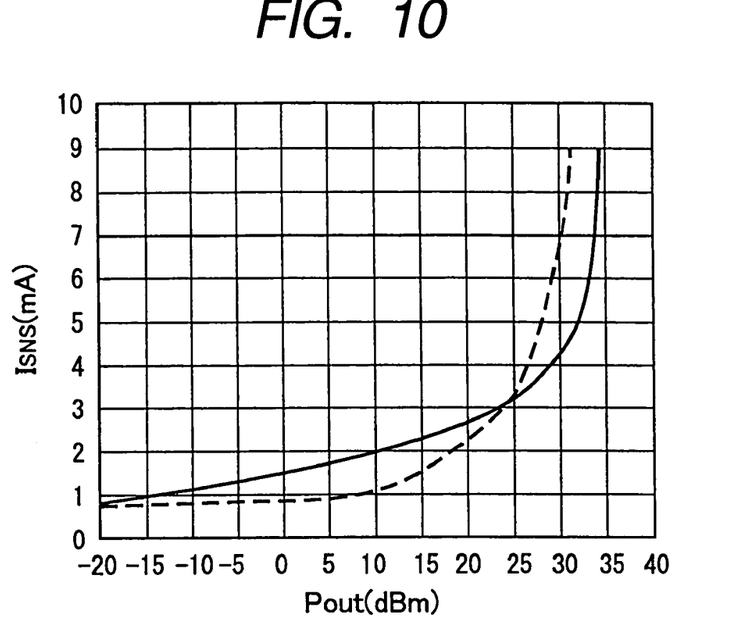
FIG. 10 is a graph showing the relation between the output power and the detected current derived from the current sensing output detection circuit in the case of the high frequency power amplifier circuit of this embodiment, and also showing the relation between the output power and the detected current derived from the current sensing output detection circuit in the case of the studied system shown in FIG. 2.

In case an output detecting MOSFET such as the FET 221 of FIG. 3 is provided for the system shown in FIG. 2 in which the first-stage FET 211 of the power amplifier circuit 200 is a single-gate FET and the input signal Pin is varied with a variable-gain amplifier (AGC) in accordance with the demanded output level, the current ISNS flowing through this detection MOSFET varies too little to obtain a sufficient detection sensitivity when the output Pout level is low as shown by the dashed line in FIG. 10.

Whereas, according to the embodiment of FIG. 3, the first-stage FET 211 of the power amplifier is a dual-gate FET, with its first gate being biased in accordance with the output control voltage Vapc, and operates at a suppressed gain by having the voltages Vg1 and Vcg of the first and second gates to meet the condition Vcg>Vg1, thereby allowing the last stage to have an increased gain in exchange. In consequence, the last-stage FET 213 can have its drain current at a low output level varying more vigorously as compared with the case of the circuit shown in FIG. 2. As a result, the current ISNS of the output detecting MOSFET 221 can vary sufficiently even at a low output level as shown by the solid line in FIG. 10, whereby the sensitivity of output current detection can be improved.

Owing to the formation of a current mirror circuit, the output detection circuit 220 of FIG. 3 can have only one output terminal of output detection. Specifically in this respect, the output detection circuit can otherwise be made up solely of an output detecting MOSFET 221, with its gate terminal supplied through a resistor Ri with the same voltage as the gate voltage of the last-stage power amplifying FET 213, and a current-voltage converting resistor (Rs) connected in series to the MOSFET 221. However, this circuit arrangement necessitates two terminals for leading out the voltage across the resistor Rs. Whereas, adopting the current mirror circuit (FETs 222 and 223) and grounding one end of resistor Rs according to this embodiment enable the circuit 220 to have only one external terminal for output detection.

Furthermore, owing to the connection of the input impedance matching capacitor Ci between the gate terminal of MOSFET 211 and the ground, the output detection circuit 220 of the embodiment of FIG. 3 can have an enhanced correlation between the drain current of the last-stage FET 213 and the drain current of the MOSFET 221. Specifically, the output detection circuit 220 receives on the gate of sensing FET 221 the same voltage as the input voltage of the last-stage power FET 213 through the resistor Ri in order to minimize the noise entering the gate of power amplifying FET 213, and a resulting increased impedance of the circuit 220 can be offset by the provision of the capacitor Ci.

Figure 11:
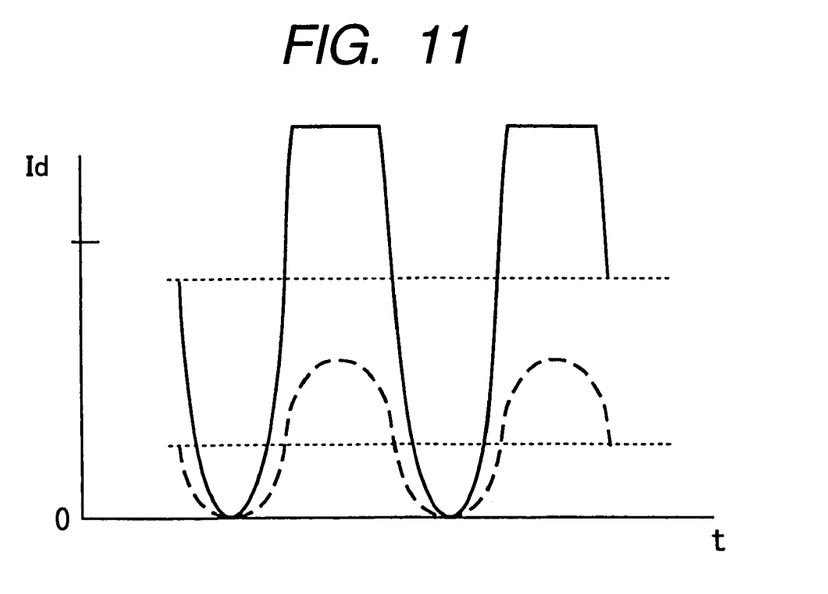
FIG. 11 is a waveform diagram showing the current of the last stage of the high frequency power amplifier circuit in the cases of a large output power and a small output power.

More specifically, the FET 213 has a low gain at a low output level and the drain current Id does not saturate as shown by the dashed line in FIG. 11. On the other hand, a higher output level causes the FET 213 to have increased gain, and the drain current Id saturates as shown by the solid line. The output detection circuit 220 having a high input impedance dulls in input signal propagation, causing the detection current ISNS to have a smaller amplitude as compared with the drain current Id of FET 213. Therefore, the detection current ISNS of the circuit 220 does not saturate even in a saturable situation of the current Id, resulting in a broken correlation between the output current Iout and the detection current ISNS. Whereas, providing the input impedance matching capacitor Ci connected to the gate of output detecting FET 221 lowers the input impedance for the input high frequency signal, causing the FET 221 to saturate when the FET 213 saturates. In consequence, the drain current Id of FET 213 and the detection current ISNS have enhanced correlation, enabling more accurate output level detection.

Figure 12:
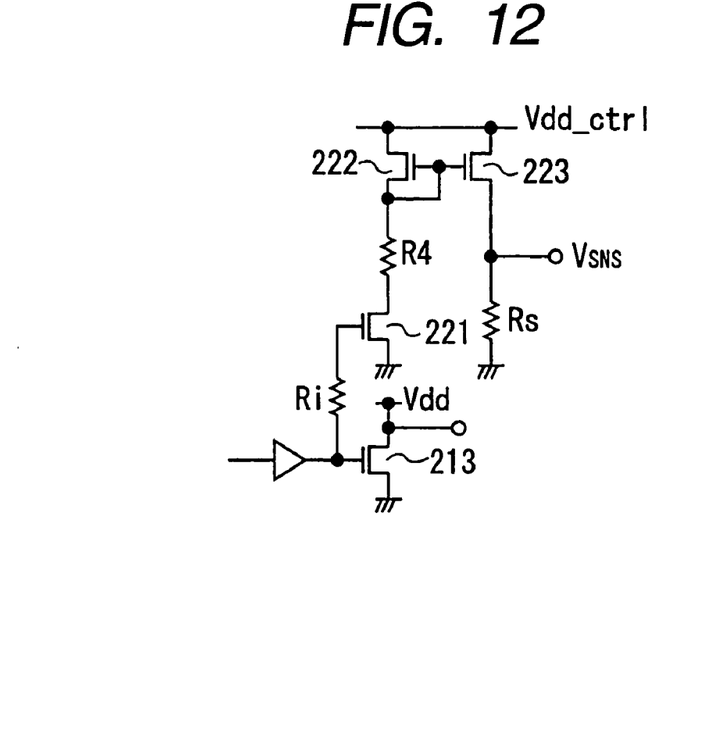
FIG. 12 is a schematic circuit diagram showing the current sensing output detection circuit based on another embodiment of this invention.

FIG. 12 shows another embodiment of the output detection circuit 220. This output detection circuit 220 includes a resistor R4, in place of the inductance element L4, connected between the output detecting FET 221 and the MOSFET 222 of current mirror circuit. Using the resistor R4 reduces the power voltage dependency of the circuit 220. Specifically, in the absence of the resistor R4, the variation of power voltage Vdd_ctrl causes the current of FET 221 to vary, whereas the presence of resistor R4 decreases the variation of drain voltage of FET 221 caused by the variation of power voltage Vdd_ctrl, resulting in a smaller variation of current flowing through the FET 221. The circuit 220 may includes both of the inductance element L4 and resistor R4.

In the circuit arrangement of FIG. 3, indicated by MS1–MS6 are micro-strip lines which are inductance elements having a function of impedance matching between the stages of high frequency power amplifier circuit 210, and MS7 and MS8 are micro-strip lines for impedance matching between the FET 213 and the output terminal Pout. The transmission system actually includes two pairs of power amplifier circuits each arranged as described above, with one circuit receiving a signal which is GMSK-modulated for GSM by the high frequency IC 100 and another circuit receiving a signal which is 8-PSK modulated for DCS and PCS by the high frequency IC 100, thereby being equipped with dual-band power modules.

In this embodiment, the first and second stage power amplifying FETs 211 and 212 and the corresponding current mirror MOSFETs 214 and 215 of the high frequency power amplifier circuit 210 (for each of GSM and EDGE), the bias control circuit 230, and the current mirror MOSFETs 222 and 223 of the output detection circuit 220 are fabricated together as a semiconductor integrated circuit IC1 on a semiconductor chip, although this affair is not compulsory. The MOSFETs 214 and 215 are of the same conductivity type (n-channel type) as the power amplifying FETs 211 and 212, thereby having the same structure and thus having the same thermal characteristics, so that the variation of characteristics of the circuit 210 caused by temperature variation can be minimized. The resistors Re and Rg which conduct a control current from the bias control circuit 230 are connected as externally attached parts to the module.

The last-stage FET 213 of the high frequency power amplifier circuit 210, the corresponding current mirror MOSFET 216, and the output detecting FET 221 are fabricated together as a semiconductor integrated circuit on another semiconductor chip. The gate input resistor Ri of the output detecting FET 221, the current-voltage converting resistor Rs connected in series to the current mirror MOSFET 223, and the input impedance matching capacitor Ci are externally attached parts.

For the dual-band design, the semiconductor integrated circuits including the last-stage FET 213, corresponding current mirror MOSFET 216, and the MOSFETs 221–223 of output detection circuit 220 are fabricated on a chip IC2 for GSM and a chip IC3 for PCS. These semiconductor chips IC1, IC2 and IC3 and the discrete parts including the resistors Re, Rg and Rs and capacitors Ci and C1–C11 are mounted on a common ceramic substrate to become a electronic component part for wireless communication. The above-mentioned micro-strip lines MS1–MS7 are formed of conductor patterns of copper or the like on the ceramic substrate so as to have intended inductance values. The assembly on the ceramic substrate including the power amplifying elements or their integrated circuit, resistors and capacitors are called here "a power module".

Figure 13:
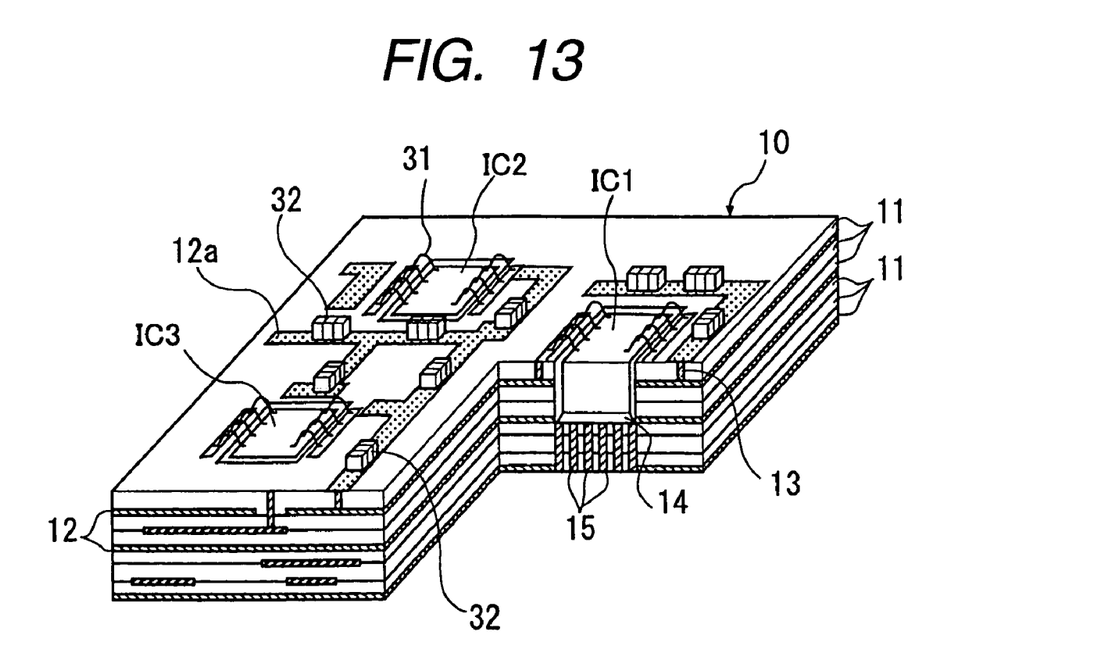
FIG. 13 is a perspective and partially cross-sectional diagram showing briefly the physical structure of a power module which incorporates the high frequency power amplifier circuit of this embodiment of invention.

FIG. 13 shows briefly the physical structure and major component parts of the power module of this embodiment. The main body 10 of power module has a laminated structure of multiple dielectric sheets 11 of aluminum and ceramics. Each dielectric sheet has on its top and/or rear surface a conductor layer 12 of copper or the like which is patterned and plated with gold. Indicated by 12a is a line pattern derived from the conductor layer 12. Each dielectric sheet 11 has thru-holes 13 filled with conductor to be used for connecting between the top and rear conductor layers 12 or line patterns.

The power module shown in FIG. 13 has six laminated dielectric sheets 11, with conductor layers 12 being formed to cover the entire rear surfaces of the first, third and sixth sheets, and these conductor layers 12 are used for conducting the ground voltage. Conductor layers 12 on the top and rear surfaces of remaining dielectric sheets 11 are used for transmission lines. The width of the conductor layers 12 and the thickness of the dielectric sheets 11 are selected properly so that the transmission lines have impedance of 50 Ω.

The first, second and third dielectric sheets 11 have rectangular openings for accommodating the semiconductor chips IC1, IC2 and IC3. Each chip is fixed to the bottom of opening (fourth sheet) by means of a fixing member 14. The fourth and lower dielectric sheets 11 have bear holes 15, which are filled with conductor for conducting the heat produced by the IC1, IC2 and IC3 to the bottom conductor layer so as to enhance the efficiency of heat dissipation.

The IC1, IC2 and IC3 have their top-surface electrodes connected electrically to certain conductor layers 12 through bonding wires 31. The first dielectric sheet 11 has on its top surface a conductor pattern 12a for forming the micro-strip lines MS1–MS8, and externally attached electronic parts including the capacitors Ci and C1–C11 and resistors Ri and Rs used for the power amplifier circuit 210 and output detection circuit 220 are mounted on this surface. Among these parts, the capacitors can alternatively be formed within the substrate by utilization of the conductor layers on the top and rear surfaces of the dielectric sheet 11.

While the present invention has been described in connection with the specific embodiments, the invention is not confined to these embodiments, but various alterations are obviously possible without departing from the essence of the invention.

For example, in the high frequency power amplifier circuit of the foregoing embodiment, the first-stage power amplifier (power FET 211) is a dual-gate MOSFET and the biasing resistors Re and Rg are used so that the second gate always has a higher voltage than that of the first gate. An alternative scheme is providing an appropriate level shift circuit, instead of the current mirror circuit and resistors Re and Rg, and biasing the first-stage FET 211 by applying the output control voltage Vapc or a derivative thereof to the second gate and applying a shift-down version of the voltage to the first gate.

The power amplifying FETs, which are three stages in the high frequency power amplifier circuits of the foregoing embodiments, may be of two stages or four or more stages. The second and third-stage FETs 212 and 213 each may be two FETs connected in parallel.

In the foregoing embodiments, the first and second-stage power amplifying FETs 211 and 212, the corresponding current mirror MOSFETs 214 and 215, and the bias control circuit 230 which feeds the bias voltages to the gate terminals of these FETs are fabricated as a semiconductor integrated circuit, and the third-stage FET 213 and the output detecting FET 221 are fabricated as another semiconductor integrated circuit. Otherwise, all of these parts, i.e., the power amplifying FETs 211–213, the corresponding current mirror FETs 214–216, and the bias control circuit 230 may be fabricated as one semiconductor integrated circuit on a chip.

INDUSTRIAL APPLICABILITY

Although the present invention has been explained in connection with the embodiments of a high frequency power amplifier circuit used for the communication of EDGE scheme in which power amplifying FETs are operated in the linear region, the present invention is also applicable to the communication equipment of other schemes such as the cdmaOne system which implements multiplexing based on the CDMA (Code Division Multiple Access) scheme and IS95 system in which power amplifying FETs of the high frequency power amplifier circuit are operated in the linear region.

For communication systems of dual-band, triple-band or higher multiplex band scheme capable of performing communication in various communication schemes such as the CDMA of WCDMA (Wideband CDMA) scheme and the GSM scheme having EDGE mode and the DCS scheme, the present invention can be used for the biasing technique for high frequency power amplifier circuits which perform amplification for the transmission based on the CDMA scheme and the transmission of EDGE mode based on the GSM scheme and DCS scheme.

What is claimed is:

1. A high frequency power amplifier circuit, comprising:
an amplifier which comprises a power amplifying FET having a first gate terminal and a second gate terminal, said power amplifying FET being adapted to have a linear operation or saturation operation depending on a bias voltage applied to the first gate terminal; and
a bias control circuit which provides the first gate terminal of said power amplifying FET with such a first bias voltage in a first operation mode that said amplifier operates in the saturation region, and such a second bias voltage in a second operation mode that said amplifier has a linear operation, and provides the second gate terminal with a third bias voltage which suppresses the gain of said power amplifying FET.

2. A high frequency power amplifier circuit according to claim 1, wherein said amplifier comprises an FET having two gate terminals for one channel region.

3. A high frequency power amplifier circuit according to claim 1, wherein said amplifier comprises two FETs connected in series.

4. A high frequency power amplifier circuit according to claim 1, including an FET which is connected to said power amplifying FET in current mirror configuration, said bias control circuit conducting certain control currents to the current mirror FET thereby to produce the bias voltages to be applied to the first and second gate terminals.

5. A high frequency power amplifier circuit for amplifying a modulated high frequency signal and releasing it, said amplifier circuit including an output detection circuit which includes a transistor for detecting the output level of the last-stage amplifier, and releasing a signal which represents the output level detected by said output detection circuit;
wherein said output detection circuit comprises a field effect transistor which receives on the gate terminal thereof an input voltage of the last-stage amplifier, and a current mirror circuit which duplicates the drain current of said field effect transistor.

6. A high frequency power amplifier circuit according to claim 1, wherein the bias voltage is made variable during the linear operation of said power amplifying FET.

7. A high frequency power amplifier circuit, comprising:
an amplifier which comprises a power amplifying FET having a first gate terminal and a second gate terminal, said power amplifying FET being adapted to have a linear operation or saturation operation depending on a bias voltage applied to the first gate terminal; and
a bias control circuit which provides the first gate terminal of said power amplifying FET with such a first bias voltage in a first operation mode that said amplifier operates in the saturation region, and such a second bias voltage in a second operation mode that said amplifier has a linear operation, and provides the second gate terminal with a third bias voltage which suppresses the gain of said power amplifying FET,
wherein said third bias voltage is higher than said first bias voltage and said second bias voltage.

8. A high frequency power amplifier circuit according to claim 7, wherein said amplifier comprises an FET having two gate terminals for one channel region.

9. A high frequency power amplifier circuit according to claim 7, wherein said amplifier comprises two FETs connected in series.

10. A high frequency power amplifier circuit according to claim 7, including a current mirror FET which is connected to said power amplifying FET in current mirror configuration, said bias control circuit conducting certain control currents to the current mirror FET thereby to produce the bias voltages to be applied to the first and second gate terminals.

11. A high frequency power amplifier circuit according to claim 7, wherein the bias voltage is made variable during the linear operation of said power amplifying FET.

* * * * *